(12) United States Patent
Nogami

(10) Patent No.: US 7,572,738 B2
(45) Date of Patent: Aug. 11, 2009

(54) CRACK STOP TRENCHES IN MULTI-LAYERED LOW-K SEMICONDUCTOR DEVICES

(75) Inventor: Takeshi Nogami, Hopewell Junction, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 317 days.

(21) Appl. No.: 11/135,313

(22) Filed: May 23, 2005

(65) Prior Publication Data
US 2006/0264035 A1 Nov. 23, 2006

(51) Int. Cl.
*H01L 21/302* (2006.01)
*H01L 21/461* (2006.01)

(52) U.S. Cl. .................. 438/740; 438/700; 257/622

(58) Field of Classification Search .................. 438/700, 438/702, 703, 622, 634, 740; 257/622, 758
See application file for complete search history.

(56) References Cited

U.S. PATENT DOCUMENTS

| | | | |
|---|---|---|---|
| 6,022,791 A * | 2/2000 | Cook et al. ................. 438/458 |
| 6,495,918 B1 * | 12/2002 | Brintzinger ................. 257/758 |
| 6,951,801 B2 * | 10/2005 | Pozder et al. ............... 438/462 |
| 7,067,925 B2 * | 6/2006 | Abell .......................... 257/774 |
| 7,109,093 B2 * | 9/2006 | Fitzsimmons et al. ....... 438/427 |
| 2002/0043700 A1 | 4/2002 | Sasaki et al. ................ 257/620 |
| 2004/0023485 A1 | 2/2004 | Pan et al. .................... 438/637 |
| 2004/0026785 A1 | 2/2004 | Tomita ....................... 257/758 |
| 2004/0038526 A1 | 2/2004 | Liu et al. .................... 438/660 |
| 2004/0101663 A1 | 5/2004 | Agarwala et al. ........... 428/209 |
| 2004/0147097 A1 | 7/2004 | Pozder et al. ............... 438/584 |
| 2005/0026397 A1 * | 2/2005 | Daubenspeck et al. ...... 438/465 |
| 2007/0007659 A1 * | 1/2007 | Narayan et al. ............. 257/769 |

* cited by examiner

Primary Examiner—S. V Clark
(74) Attorney, Agent, or Firm—Mayer & Williams PC; Karin L. Williams, Esq.

(57) ABSTRACT

A method is provided for fabricating a semiconductor device. The method begins by forming on a substrate an interconnect stack layer that includes a plurality of layers with interconnecting metal overlying the substrate. After forming the interconnect stack layer, a crack stop trench is formed in the interconnect stack layer. Finally, the crack stop trench is filled with a prescribed material.

18 Claims, 5 Drawing Sheets

CRACK STOP TRENCHES IN MULTI-LAYERED LOW-K SEMICONDUCTOR DEVICES

FIELD OF THE INVENTION

The present invention relates generally to dual damascene interconnections for integrated circuits, and more specifically to a dual damascene interconnection having a low k layer with trenches to prevent cracking.

BACKGROUND OF THE INVENTION

The manufacture of integrated circuits in a semiconductor device involves the formation of a sequence of layers that contain metal wiring. Metal interconnects and vias which form horizontal and vertical connections in the device are separated by insulating layers or inter-level dielectric layers (ILDs) to electrically isolate wires from each other and to prevent crosstalk between the metal wiring that can degrade device performance. A popular method of forming an interconnect structure is a dual damascene process in which vias and trenches are filled with metal in the same step to create multi-level, high density metal interconnections needed for advanced high performance integrated circuits. The most frequently used approach is a via first process in which a via is formed in a dielectric layer and then a trench is formed above the via. Recent achievements in dual damascene processing include lowering the resistivity of the metal interconnect by switching from aluminum to copper, decreasing the size of the vias and trenches with improved lithographic materials and processes to improve speed and performance, and reducing the dielectric constant (k) of insulators or ILDs by using so-called low k materials to avoid capacitance coupling between the metal interconnects. The expression "low-k" material has evolved to characterize materials with a dielectric constant less than about 3.9. One class of low-k material that have been explored are organic low-k materials, typically having a dielectric constant of about 2.0 to about 3.8, which may offer promise for use as an ILD.

One difficulty that arises when the dielectric layers are formed from low-k materials is that the reduced strength of the low-k materials, in combination with thinner layers, frequently results in cracking when such materials are subjected to mechanical and thermal stresses. Typical low-k materials in use have included carbon doped silicon dioxide such as commercially available Black Diamond™ and other materials that tend to be porous, thereby reducing the overall dielectric constant. Porous low-k materials have a drawback in that the porosity tends to weaken the overall strength and hardness of the material making crack initiation and propagation more likely. As the requirement for device density increases, the number of levels in an integrated circuit structure has increased to 4 to 10 or more levels. The increased number of material layers contributes to the buildup of compressive and tensile stresses in the multiple layers, especially when subjected to thermal and mechanical stresses, which frequently do not offset one another. The result is that cracking becomes more likely as the number of layers increase and the process wafer is subjected to externally induced stresses that arise when the wafer is cut into the individual dies.

One known approach to alleviate these stresses is to provide crack stop trenches that are located at the die edge to prevent cracking of the die. The crack stop trenches are generally formed simultaneously with the trenches and vias of the metal interconnects. That is, the same lithographic steps used in forming the interconnects, including patterning, etching of the pattern, removal of the mask, and etching, are generally used to form the crack stop trenches. One problem with this approach is that the lithographic steps used to form the metal interconnects are optimized to form lithographic features (e.g., trench and via widths) with relatively small dimensions suitable for higher device densities. Unfortunately, the width of the crack stop trenches are preferably one or more orders of magnitude greater than the width of the trenches used for the metal interconnects. This limitation can be mitigated to some extent by providing two or more crack stop trenches in parallel with one another. Moreover, since the crack stop trenches are formed at the same time as the metal interconnects, the conductive material (e.g., copper) filling both types of trenches is generally the same. While this material is typically chosen to have a suitably low dielectric constant, it generally will not also provide the optimal immunity to cracking that is desired. Accordingly, the formation of the interconnect trenches and vias and the crack stop trenches in the same process steps is often problematic.

SUMMARY OF THE INVENTION

In accordance with the present invention, a method is provided for fabricating a semiconductor device. The method begins by forming on a substrate an interconnect stack layer that includes a plurality of layers with interconnecting metal overlying the substrate. After forming the interconnect stack layer, a crack stop trench is formed in the interconnect stack layer. Finally, the crack stop trench is filled with a prescribed material.

In accordance with one aspect of the invention, the crack stop trench is continuous and surrounds the interconnect stack layer.

In accordance with another aspect of the invention, the prescribed material is a carbon polymer dielectric.

In accordance with another aspect of the invention, the step of forming the interconnect stack layer includes the steps of: forming on the substrate a dielectric layer that includes an organosilicon material; forming a via photoresist pattern over the dielectric layer; etching an interconnect via in the dielectric layer using the via photoresist pattern as an etch mask; removing the via photoresist pattern; forming a trench photoresist pattern over the dielectric layer; etching an interconnect trench in the dielectric layer using the trench photoresist pattern as an etch mask, the trench being connected to the interconnect via; removing the trench photoresist pattern; forming a barrier layer overlying the interconnect via and the interconnect trench; and completing interconnections by filling the interconnect trench and the interconnect via with copper.

In accordance with another aspect of the invention, the crack stop trench has a lateral dimension greater than a lateral dimension of a trench in the interconnect stack layer.

In accordance with another aspect of the invention, the crack stop trench has a lateral dimension one or more orders of magnitude greater than a lateral dimension of a trench in the interconnect stack layer.

In accordance with another aspect of the invention, the barrier layer is selected from the group consisting of tantalum, tantalum nitride, titanium, titanium silicide or zirconium.

In accordance with another aspect of the invention, a lower interconnection is formed on the substrate and an etch stop layer is formed on the lower interconnection.

In accordance with another aspect of the invention, the etch stop layer is formed of at least one of SiC, SiN, and SiCN.

In accordance with another aspect of the invention, the dielectric layer is formed using chemical vapor deposition.

In accordance with another aspect of the invention, a capping layer is formed on the dielectric layer and the interconnect via is formed in the capping layer and the dielectric layer.

In accordance with another aspect of the invention, the capping layer is formed of at least one of $SiO_2$, SiOF, SiON, SiC, SiN and SiCN.

In accordance with another aspect of the invention, a photoresist pattern is formed on the capping layer to define the via and the capping layer and the dielectric layer are etched using the photoresist pattern as an etch mask.

In accordance with another aspect of the invention, the trench photoresist pattern in formed on the capping layer.

In accordance with another aspect of the invention, the etching is a dry etch using $C_xF_y$ or $C_xH_yF_z$ as a main etching gas and the photoresist pattern is removed using an $H_2$-based plasma.

In accordance with another aspect of the invention, a semiconductor wafer is provided. The semiconductor wafer includes a substrate, an interconnect stack layer that includes a plurality of layers with interconnecting metal overlying the substrate, and a crack stop trench located in the interconnect stack layer. The crack stop trench is filled with a prescribed material different from the interconnecting metal.

DETAILED DESCRIPTION

The methods and structures described herein do not form a complete process for manufacturing semiconductor device structures. The remainder of the process is known to those of ordinary skill in the art and, therefore, only the process steps and structures necessary to understand the present invention are described herein.

The present invention can be applied to microelectronic devices, such as highly integrated circuit semiconductor devices, processors, micro electromechanical (MEM) devices, optoelectronic devices, and display devices. In particular, the present invention is highly useful for devices requiring high-speed characteristics, such as central processing units (CPUs), digital signal processors (DSPs), combinations of a CPU and a DSP, application specific integrated circuits (ASICs), logic devices, and SRAMs.

Herein, an opening exposing a lower interconnection is referred to as a via, and a region where interconnections will be formed is referred to as a trench. Hereinafter, the present invention will be described by way of an example of a via-first dual damascene process. However the present invention is also applicable to other dual damascene processes as well.

Figure 1:
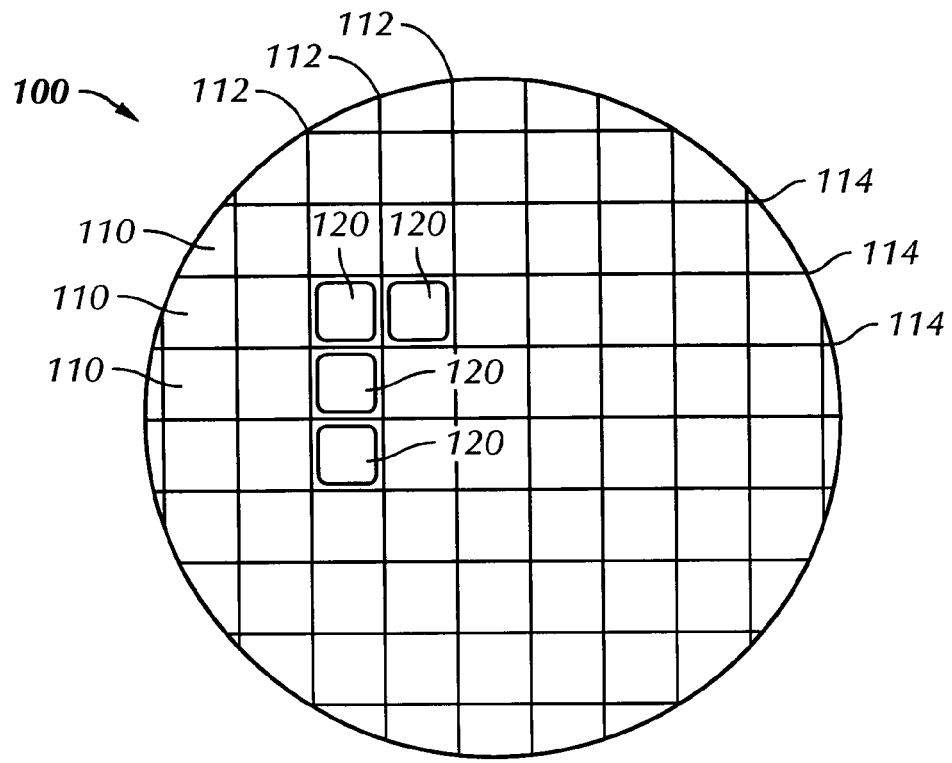
FIG. 1 shows a plan view of semiconductor wafer constructed in accordance with the present invention.

FIG. 1 shows a plan view of semiconductor wafer 100 in accordance with the present invention, which includes multiple dies 110. The individual dies, which each contain a distinct integrated circuit, are separated from one another along scribe lines 112 and 114, typically by a mechanical process using a saw blade or by a non-contact process such as with a laser. One or more crack stop trenches 120 are formed around the periphery of each die 110 to prevent cracking of the die during the separation process.

Figure 2:
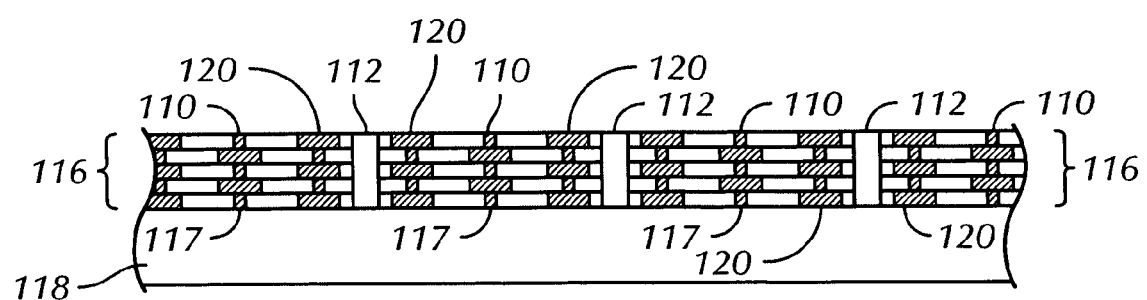
FIG. 2 shows a partial cross-sectional view through semiconductor wafer of FIG. 1.

FIG. 2 shows a partial cross-sectional view through semiconductor wafer 100. As shown, dies 110 each include an interconnect stack layer 116 located on top of substrate 118. Stack layer 116 includes multiple layers of dielectric material and interconnecting electrical conductive structures such as the aforementioned trenches and vias. For example, metal interconnect structures 117 are shown in dies 110. Also shown in FIG. 2 are crack stop trenches 120 located at the periphery of the dies 110, adjacent to the scribe lines 112 and 114 seen in FIG. 1. The interconnecting electrically conductive structures 117 are filled with metal (e.g., copper, aluminum, silver, gold) and electrically couple semiconductor devices (not shown) that are formed in substrate 118. The multiple layers of interconnect stack layer 116 are generally formed by a dual damascene process.

In the present invention the trenches and vias in the interconnect structure(s) 117 and the crack stop trenches are formed in different process steps. More particularly, the interconnect structures 117 will generally be formed prior to the crack stop trenches 120 and the crack stop trenches 120 will be subsequently formed in the interconnect structures 117. In this way separate lithographic processes can be used in the formation of the interconnect stack layer and the crack stop trenches 120, each of which can be optimized for the appropriate feature dimensions. In other words, lithographic techniques more suitable for producing very fine or small features can be used in the formation of the interconnect structures while lithographic techniques more suitable for producing larger feature dimensions can be used in the formation of the crack stop trenches. In addition to the limitations arising from lithographic techniques, process steps such as CMP (chemical mechanical polishing) and dry etching generally have been optimized for fine patterns only. If patterns larger in dimension are required, process problems such as particle generation may occur, causing a serious reduction in production yield. Therefore, all the patterns laid on the wafers follows strict design rules so that these process problems can be avoided. In the conventional approach, the patterns defining the crack stop trenches also have to follow these design rules. As a result, the dimensions of the crack stopper are limited to ones much smaller than are ideal. Moreover, in addition to an increase in dimension, the present invention also allows material used to fill the crack stop trenches to be different from the material used to fill the vias and trenches in the interconnect stack structure, thereby allowing the use of materials that better resist cracking.

A method of fabricating dual damascene interconnections according to an embodiment of the present invention will now be described with reference to FIG. 3 through 10. For purposes of illustration only and not as a limitation on the invention, only a single die is shown in FIGS. 3-10. Of course, more generally, the present invention encompasses wafers that include multiple dies that need to be separated from one another after fabrication. Likewise, only a single interconnect structure 117 comprising a single trench and via are shown. More generally, of course, each die may include multiple interconnect structures each having multiple trenches and vias that may constitute upwards of, e.g., 4-10 interconnect levels. It should be noted that the dimensions of various features shown in the drawings are not necessarily to scale. In particular, the lateral dimensions of the crack stop trenches (e.g., trench 410 seen in FIG. 10) are generally substantially larger, e.g., by 1 or 2 orders of magnitude, than the lateral dimensions of the interconnect structures (e.g., interconnection structure 395 seen in FIG. 10). Modern ultra large scale integrated circuits have representative dimensions ranging from 90 nm to 65 nm and have metal interconnects with widths, in other words, trench width, that usually ranges from about a few microns to 100 nm. Conventionally, the crack stopping layers in the typical LSI chips have dimensions that are similar to those for the fine interconnects because of the aforementioned processing problems. In general, metal wires at upper levels are wider than the lower levels. Accordingly, the crack stop trenches generally follow this same pattern.

Figure 3:
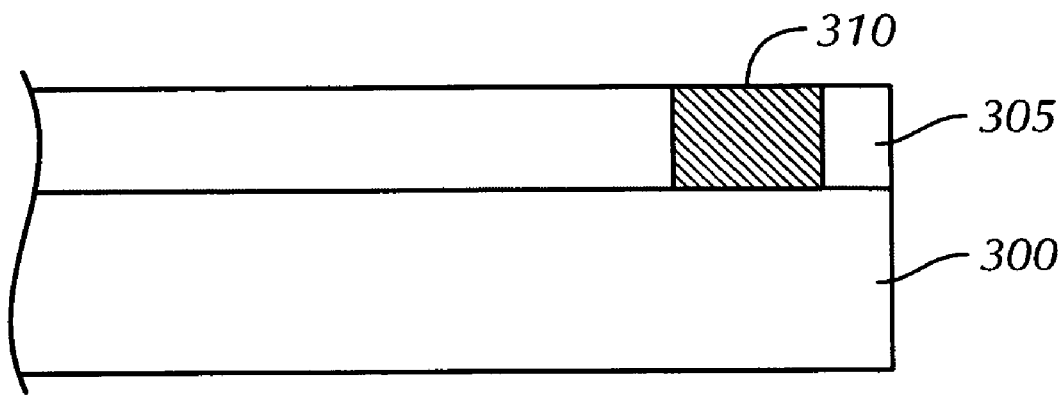
FIGS. 3-10 show the process steps involved in an exemplary process flow used to form the semiconductor wafer seen in FIGS. 1 and 2.

As shown in FIG. 3, the process begins with the provision of a substrate 300. The interconnect stack layer 116 seen in FIG. 2 includes a lower inter-level dielectric layer (ILD) 305 including a lower interconnection 310 is formed on the substrate 300. The substrate 300 may be, for example, a silicon substrate, a silicon on insulator (SOI) substrate, a gallium arsenic substrate, a silicon germanium substrate, a ceramic substrate, a quartz substrate, or a glass substrate for display. Various active devices and passive devices may be formed on the substrate 300. The lower interconnection 310 may be formed of various interconnection materials, such as copper, copper alloy, aluminum, and aluminum alloy. The lower interconnection 310 is preferably formed of copper because of its low resistance. Also, the surface of the lower interconnection 310 is preferably planarized.

Figure 4:
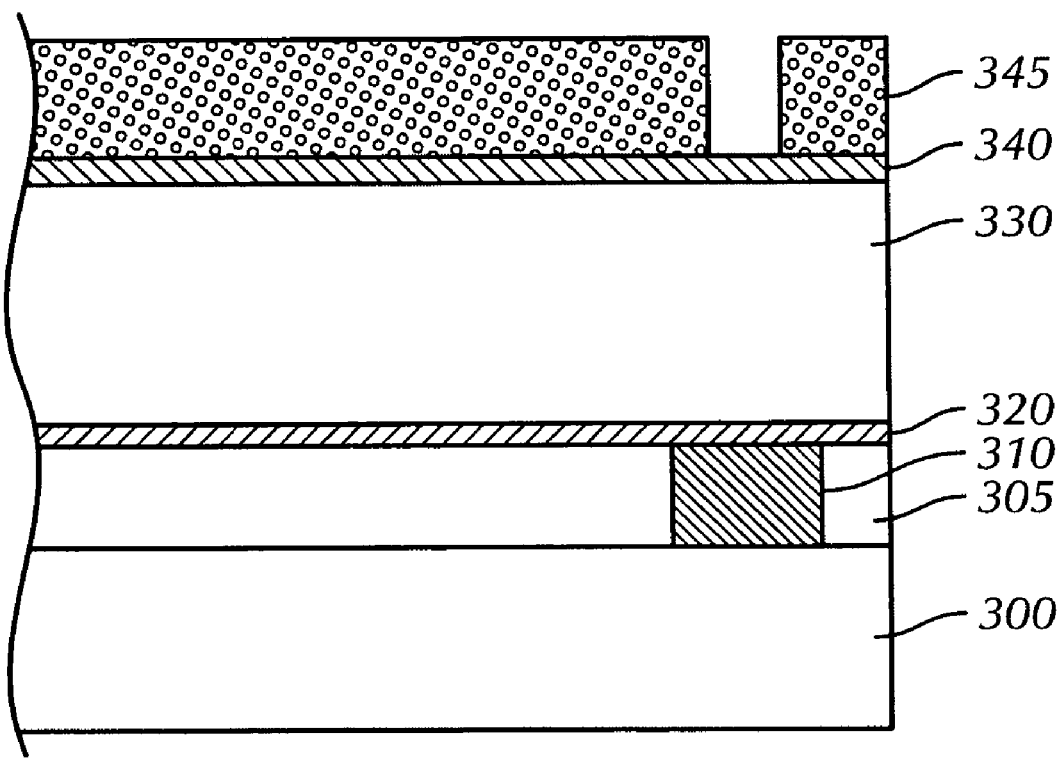

Referring to FIG. 4, an etch stop layer 320, a low-k ILD 330, and a capping layer 340 are sequentially stacked on the surface of the substrate 300 where the lower interconnection 310 is formed, and a photoresist pattern 345 is formed on the capping layer 340 to define a via.

The etch stop layer 320 is formed to prevent electrical properties of the lower interconnection 310 from being damaged during a subsequent etch process for forming a via. Accordingly, the etch stop layer 320 is formed of a material having a high etch selectivity with respect to the ILD 330 formed thereon. Preferably, the etch stop layer 320 is formed of SiC, SiN, or SiCN, having a dielectric constant of 4 to 5. The etch stop layer 320 is as thin as possible in consideration of the dielectric constant of the entire ILD, but thick enough to properly function as an etch stop layer.

The ILD 330 is formed of a hybrid low-k dielectric material, which has advantages of organic and inorganic materials. That is, the ILD 330 is formed of a hybrid low-k dielectric material having low-k characteristics, which can be formed using a conventional apparatus and process, and which is thermally stable. The ILD 330 has a dielectric constant of e.g., 3.5 or less, to prevent an RC delay between the lower interconnection 310 and dual damascene interconnections and minimize cross talk and power consumption. For example, the ILD 330 may be formed from a low-k organosilicon material such as Black Diamond™, Silk™, CORAL™, or a similar material. The ILD 330 can be formed using chemical vapor deposition (CVD), and more specifically, plasma-enhanced CVD (PECVD). The ILD 330 may be also formed from low k materials such as spin-on organics and organo silicates. The ILD 330 is formed to a thickness of about 3,000 angstroms to 20,000 angstroms or other appropriate thicknesses determined by those skilled in the art.

The capping layer 340 prevents the ILD 330 from being damaged when dual damascene interconnections are planarized using chemical mechanical polishing (CMP). Thus, the capping layer 340 may be formed of $SiO_2$, SiOF, SiON, SiC, SiN, or SiCN. The capping layer 340 may also function as an anti-reflection layer (ARL) in a subsequent photolithographic process for forming a trench. In this case the capping layer 340 is more preferably formed of $SiO_2$, SiON, SiC, or SiCN.

Figure 5:
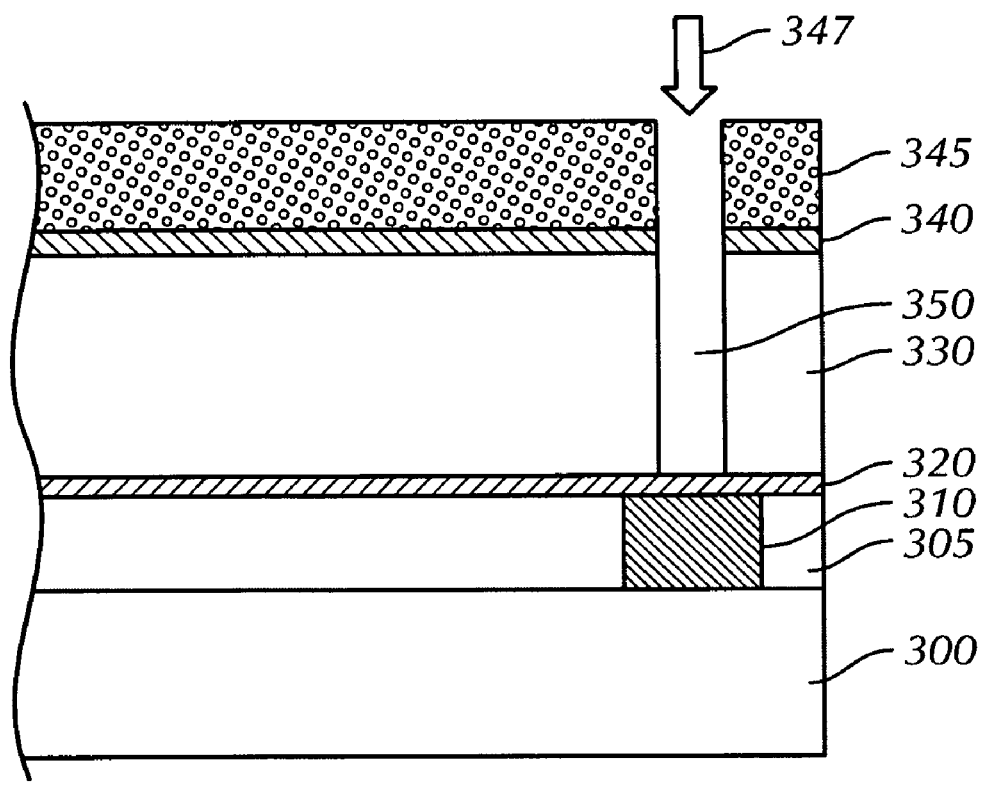

The via photoresist pattern 345 is formed by forming a layer of a photoresist and then performing exposure and developing processes using a photo mask defining a via. Referring to FIG. 5, the ILD 330 is anisotropically etched (347) using the photoresist pattern 345 as an etch mask to form a via 350. The ILD 330 can be etched, for example, using a reactive ion beam etch (RIE) process, which uses a mixture of a main etch gas (e.g., $C_xF_y$ and $C_xH_yF_z$), an inert gas (e.g. Ar gas), and possibly at least one of $O_2$, $N_2$, and $CO_x$. Here, the RIE conditions are adjusted such that only the ILD 330 is selectively etched and the etch stop layer 320 is not etched.

Figure 6:
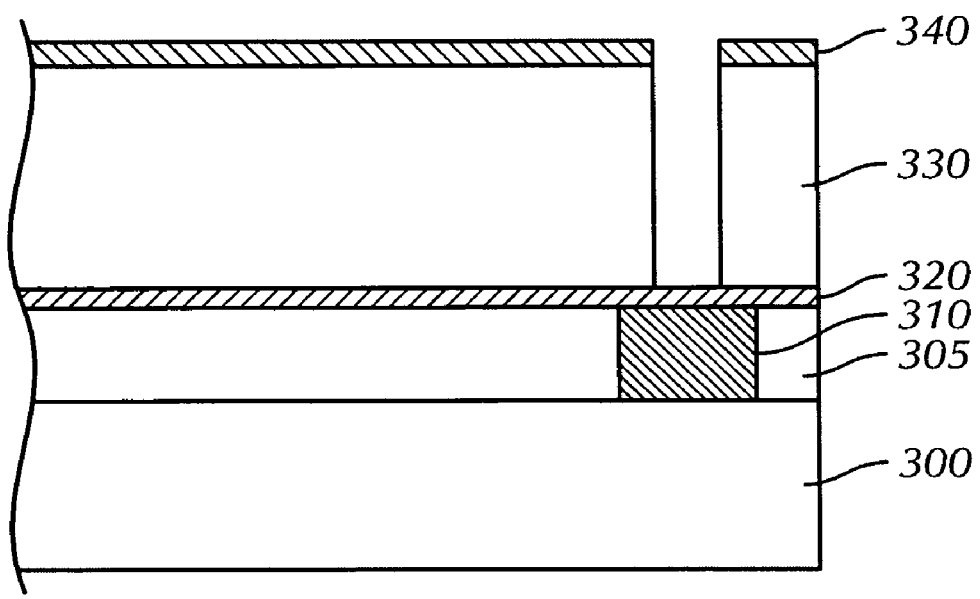
Figure 7:
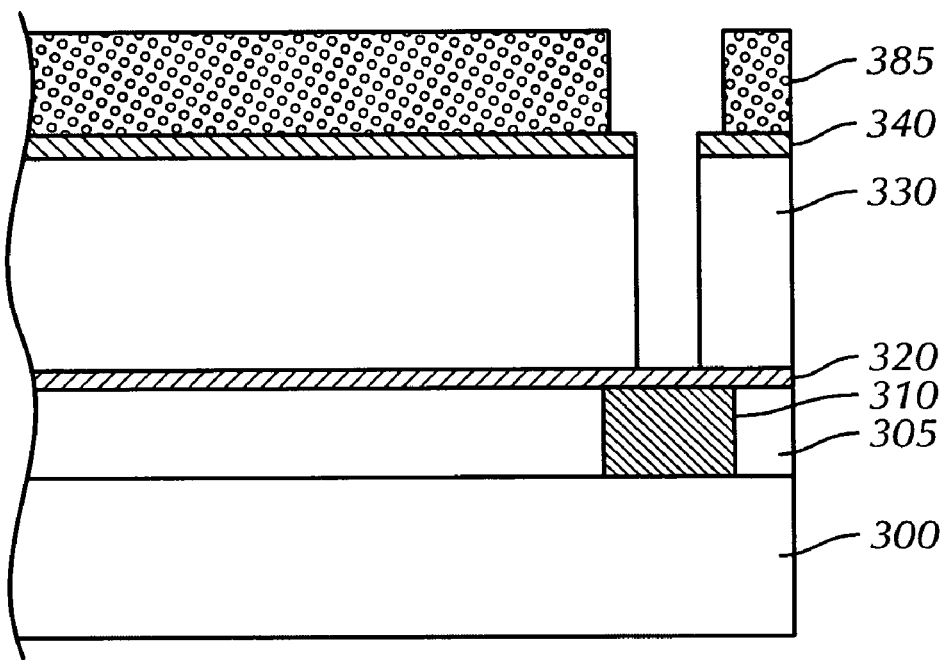
Figure 8:
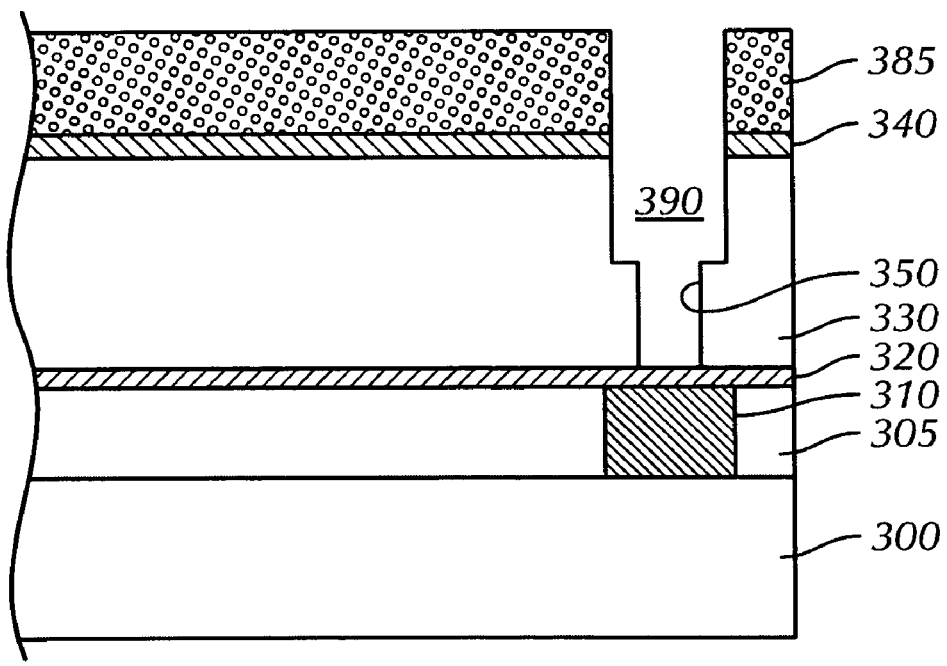

Referring to FIG. 6, the via photoresist pattern 345 is removed using a plasma etch, for example. Referring to FIG. 7, a trench photoresist pattern 385 is formed, followed by formation of a trench 390 in FIG. 8. The capping layer 340 is etched using the photoresist pattern 385 as an etch mask, and then the ILD 330 is etched to a predetermined depth to form the trench 390. The resulting structure, shown in FIG. 9, defines a dual damascene interconnection structure 395, which includes the via 350 and the trench 390.

Figure 9:
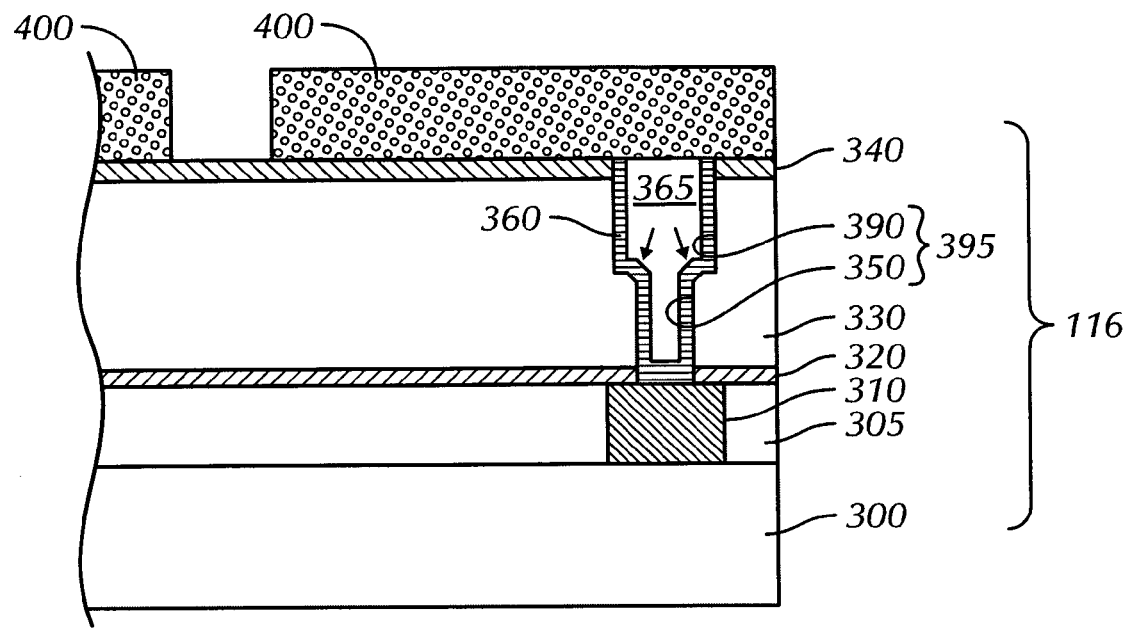

Referring to FIG. 9, the etch stop layer 320 exposed in the via 350 is etched until the lower interconnection 310 is exposed, thereby completing the dual damascene interconnection region 395. The etch stop layer 320 is etched so that the lower interconnection 310 is not affected and only the etch stop layer 320 is selectively removed.

A barrier layer 360 is formed on the dual damascene interconnection region 395 to prevent the subsequently formed conductive layer from diffusing into ILD 330. The barrier layer 360 is generally formed from a conventional material such as tantalum, tantalum nitride, titanium, titanium silicide or zirconium. After formation of the barrier layer 360 the copper conductive layer is formed on the barrier layer by an electroplating process. The bulk copper layer 365 is formed on the dual damascene interconnection region 395 by electroplating and then planarized, thereby forming a dual damascene interconnection.

Figure 10:
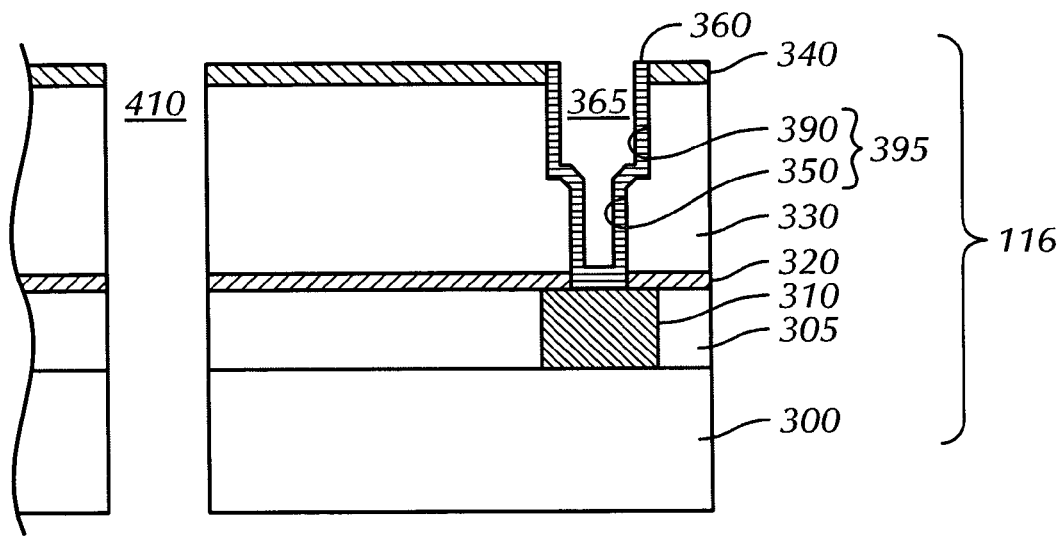

Next, in FIG. 9, a crack stop trench photoresist pattern 400 is formed, followed by formation of crack stop trench 410 in FIG. 10. The capping layer 340 is etched using the photoresist pattern 400 as an etch mask, and then the ILD 330, etch stop 320, and ILD 305 are etched to a predetermined depth to form the trench 410. Crack stop trench 410 is then filled with a material either metal or dielectric that is resistant to cracking such as a carbon polymer dielectric, for example. Other materials that may be used to fill the crack stop trench 410 including Silk™, metals such as aluminum, copper, tungsten and their alloys. Finally, crack stop trench photoresist pattern 400 is removed.

Although various embodiments are specifically illustrated and described herein, it will be appreciated that modifications and variations of the present invention are covered by the above teachings and are within the purview of the appended claims without departing from the spirit and intended scope of the invention. For example, those of ordinary skill in the art will recognize that the via-first dual damascene process described with reference to FIGS. 3 through 10 can be applied to a trench-first dual damascene process.

The invention claimed is:
1. A method of fabricating a semiconductor device, the method comprising:
 (a) forming on a substrate an interconnect stack that includes a plurality of layers with interconnecting metal overlying the substrate;

(b) subsequent to step (a), forming a crack stop trench extending through the plurality of layers of the interconnect stack;
(c) filling the crack stop trench with a prescribed material;
(d) forming on the substrate a dielectric layer that includes an organosilicon material;
(e) forming a via photoresist pattern over the dielectric layer;
(f) etching an interconnect via in the dielectric layer using the via photoresist pattern as an etch mask;
(g) removing the via photoresist pattern;
(h) forming a trench photoresist pattern over the dielectric layer;
(i) etching an interconnect trench in the dielectric layer using the trench photoresist pattern as an etch mask, said trench being connected to the interconnect via;
(j) removing the trench photoresist pattern;
(k) forming a barrier layer overlying the interconnect via and the interconnect trench; and
(l) completing interconnections by filling the interconnect trench and the interconnect via with copper.

2. The method of claim 1 wherein the crack stop trench is continuous and surrounds a part of the interconnect stack forming a die area of the semiconductor device.

3. The method of claim 1 wherein the prescribed material is a carbon polymer dielectric.

4. A method of fabricating a semiconductor device, the method comprising:
(a) forming on a substrate an interconnect stack that includes an interconnect trench and a plurality of layers with interconnecting metal overlying the substrate;
(b) subsequent to step (a), forming a crack stop trench extending through the plurality of layers of the interconnect stack; and
(c) filling the crack stop trench with a prescribed material, wherein said crack stop trench has a lateral dimension greater than a lateral dimension of the interconnect trench in said interconnect stack.

5. The method of claim 1 wherein said crack stop, trench has a lateral dimension one or more orders of magnitude greater than a lateral dimension of the interconnect trench in said interconnect stack.

6. The method of claim 1 wherein the barrier layer is selected from the group consisting of tantalum, tantalum nitride, titanium, titanium silicide or zirconium.

7. The method of claim 1, further comprising, before step (d): forming a lower interconnection on the substrate; and forming an etch stop layer on the lower interconnection.

8. The method of claim 7, wherein the etch stop layer is formed of at least one of SiC, SiN, and SiCN.

9. The method of claim 1, wherein the dielectric layer is formed using chemical vapor deposition.

10. The method of claim 1, further comprising, before step (e), forming a capping layer on the dielectric layer, wherein in step (f), the interconnect via is formed in the capping layer and the dielectric layer.

11. The method of claim 10, wherein the capping layer is formed of at least one of $SiO_2$, SiOF, SiON, SiC, SiN, and SiCN.

12. The method of claim 10, wherein step (e) comprises: forming a photoresist pattern on the capping layer to define the via; and etching the capping layer and the dielectric layer using the photoresist pattern as an etch mask.

13. The method of claim 12 wherein the trench photoresist pattern in formed on the capping layer.

14. The method of claim 12, wherein the etching is a dry etch using $C_xF_y$ or $C_xH_yF_z$ as a main etching gas, and removing the photoresist pattern uses an $H_2$-based plasma.

15. A semiconductor wafer comprising:
a substrate;
an interconnect stack that includes a plurality of layers with interconnecting metal overlying the substrate; and
at least one crack stop trench extending through the interconnect stack, said at least one crack stop trench being filled with a prescribed material different from the interconnecting metal,
wherein said crack stop trench has a lateral dimension greater than a lateral dimension of the interconnect in said interconnect stack.

16. The semiconductor wafer of claim 15 wherein a plurality of crack stop trenches extend through the interconnect stack, and wherein each of said plurality of crack stop trenches arc continuous and extends around a periphery of a part of the interconnect stack forming a die area of the semiconductor wafer.

17. The semiconductor wafer of claim 15 wherein the prescribed material is a carbon polymer dielectric.

18. The semiconductor wafer of claim 15 wherein said crack stop trench has a lateral dimension one or more orders of magnitude greater than a lateral dimension of the interconnect in said interconnect stack.

* * * * *

UNITED STATES PATENT AND TRADEMARK OFFICE
CERTIFICATE OF CORRECTION

PATENT NO. : 7,572,738 B2
APPLICATION NO. : 11/135313
DATED : August 11, 2009
INVENTOR(S) : Takeshi Nogami et al.

It is certified that error appears in the above-identified patent and that said Letters Patent is hereby corrected as shown below:

Col. 3, line 14, after "pattern", change "in" to -- is --.

Col. 5, line 3, after "usually", change "ranges" to -- range --.

Col. 6, lines 47-48, after "trench 410", change "including" to -- include --.

Claim 5, Col. 7, line 41, after "crack", change "stop, trench" to -- stop trench --.

Claim 11, Col. 8, line 13, after "SiC,", change "SiN, and" to -- SiN and --.

Claim 16, Col. 8, line 38, after "trenches", change "arc" to -- is --.

Signed and Sealed this

Twenty-seventh Day of October, 2009

David J. Kappos
*Director of the United States Patent and Trademark Office*

UNITED STATES PATENT AND TRADEMARK OFFICE
CERTIFICATE OF CORRECTION

PATENT NO. : 7,572,738 B2  Page 1 of 1
APPLICATION NO. : 11/135313
DATED : August 11, 2009
INVENTOR(S) : Takeshi Nogami It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 571 days.

Signed and Sealed this

Seventh Day of September, 2010

David J. Kappos
*Director of the United States Patent and Trademark Office*